(12) United States Patent  
Nishitsuji et al.

(10) Patent No.: US 12,047,664 B2  
(45) Date of Patent: Jul. 23, 2024

(54) LIGHT SHIELDING PLATE, CAMERA UNIT, ELECTRONIC DEVICE, AND METHOD OF PRODUCING THE LIGHT SHIELDING PLATE

(71) Applicant: TOPPAN INC., Tokyo (JP)

(72) Inventors: Kiyoaki Nishitsuji, Tokyo (JP); Shinichi Shimamura, Tokyo (JP)

(73) Assignee: TOPPAN INC., Tokyo (JP)

(*) Notice: Subject to any disclaimer, the term of this patent is extended or adjusted under 35 U.S.C. 154(b) by 252 days.

(21) Appl. No.: 17/577,649

(22) Filed: Jan. 18, 2022

(65) Prior Publication Data

US 2022/0141362 A1 May 5, 2022

Related U.S. Application Data

(63) Continuation of application No. PCT/JP2020/027894, filed on Jul. 17, 2020.

(30) Foreign Application Priority Data

Jul. 19, 2019 (JP) .................................. 2019-134036  
Jul. 19, 2019 (JP) .................................. 2019-134037  
(Continued)

(51) Int. Cl.  
*H04N 23/55* (2023.01)  
*C23C 16/30* (2006.01)  
(Continued)

(52) U.S. Cl.  
CPC ............ *H04N 23/55* (2023.01); *C23C 16/30* (2013.01); *C23F 1/02* (2013.01); *G02B 1/113* (2013.01);  
(Continued)

(58) Field of Classification Search  
CPC ........ H04N 23/55; H04N 23/50; H04N 23/51; C23C 16/30; C23F 1/02; C23F 1/04;  
(Continued)

(56) References Cited

U.S. PATENT DOCUMENTS

2006/0051085 A1* 3/2006 Okumura .................. G03B 9/04  
396/505  
2008/0225410 A1* 9/2008 Ning ...................... G02B 7/022  
359/830  
(Continued)

FOREIGN PATENT DOCUMENTS

CN 101546132 A 9/2009  
CN 103205712 A * 7/2013 ............. H01L 51/56  
(Continued)

OTHER PUBLICATIONS

Office Action issued in corresponding Taiwanese Patent Application No. 109124325 dated Jun. 25, 2021.  
(Continued)

*Primary Examiner* — Nhan T Tran  
(74) *Attorney, Agent, or Firm* — Foley & Lardner LLP

(57) ABSTRACT

A light shielding plate includes a front surface that is located on a light incident side, a rear surface that is a surface facing away from the front surface, and an aperture that penetrates through the front surface and the rear surface. The aperture has a first aperture portion and a second aperture portion that is connected to the first aperture portion via a central opening, and the first aperture portion extends from a rear opening in the rear surface toward the central opening and has a shape tapered from the rear surface toward the front surface. The second aperture portion extends from a rear opening in the front surface to the central opening and has a shape tapered from the front surface toward the rear surface. The front opening is larger than the rear opening.

10 Claims, 5 Drawing Sheets

(30) Foreign Application Priority Data

| | | |
|---|---|---|
| Jul. 19, 2019 | (JP) | 2019-134038 |
| Sep. 13, 2019 | (JP) | 2019-167431 |
| Sep. 13, 2019 | (JP) | 2019-167432 |
| Sep. 13, 2019 | (JP) | 2019-167433 |

(51) Int. Cl.

| | |
|---|---|
| *C23F 1/02* | (2006.01) |
| *G02B 1/113* | (2015.01) |
| *G02B 5/00* | (2006.01) |
| *H04N 23/50* | (2023.01) |
| *H04N 23/51* | (2023.01) |

(52) U.S. Cl.
CPC ............ *G02B 5/005* (2013.01); *H04N 23/50* (2023.01); *H04N 23/51* (2023.01)

(58) Field of Classification Search
CPC .......... C23F 1/00; G02B 1/113; G02B 5/005; G03B 9/02; G03B 30/00; G03B 11/04; G03B 7/02
See application file for complete search history.

(56) References Cited

U.S. PATENT DOCUMENTS

| | | |
|---|---|---|
| 2011/0109970 A1 | 5/2011 | Abe et al. |
| 2022/0137270 A1 | 5/2022 | Nishitsuji et al. |
| 2022/0141361 A1 | 5/2022 | Nishitsuji et al. |
| 2022/0141362 A1 | 5/2022 | Nishitsuji et al. |

FOREIGN PATENT DOCUMENTS

| | | |
|---|---|---|
| JP | 2002-229095 A | 8/2002 |
| JP | 2006-72151 A | 3/2006 |
| JP | 2008-257134 A | 10/2008 |
| JP | 2010-008786 A | 1/2010 |
| JP | 2021-018402 A | 2/2021 |
| TW | 200949298 A | 12/2009 |
| WO | WO 2016/060198 A | 4/2016 |

OTHER PUBLICATIONS

Japanese Office Action issued in connection with JP Appl. Ser. No. 2022-176991 dated May 30, 2023.

International Searching Authority, "International Search Report," issued in connection with International Patent Application No. PCT/JP2020/027894, dated Oct. 6, 2020, 5 pages.

International Searching Authority, "Written Opinion," issued in connection with International Patent Application No. PCT/JP2020/027894, dated Oct. 6, 2020, 4 pages.

Office Action issued in corresponding Chinese Patent Application No. 202080050763.0, dated Apr. 7, 2023.

* cited by examiner

LIGHT SHIELDING PLATE, CAMERA UNIT, ELECTRONIC DEVICE, AND METHOD OF PRODUCING THE LIGHT SHIELDING PLATE

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/027894, filed on Jul. 17, 2020, which is based upon and claims the benefit of priority to Japanese Patent Application No. 2019-134036, filed on Jul. 19, 2019; Japanese Patent Application No. 2019-134037, filed on Jul. 19, 2019; Japanese Patent Application No. 2019-134038, filed on Jul. 19, 2019; Japanese Patent Application No. 2019-167431, filed on Sep. 13, 2019; Japanese Patent Application No. 2019-167432, filed on Sep. 13, 2019; Japanese Patent Application No. 2019-167433, filed on Sep. 13, 2019; the disclosures of which are incorporated herein by reference in their entirety.

TECHNICAL FIELD

The present invention relates to light shielding plates, camera units including the light shielding plates, electronic devices including the camera units, and a method of producing the light shielding plates.

BACKGROUND

Camera units provided to electronic devices, such as smartphones, include light shielding plates that serve as apertures for external light. Resin light shielding plates are widely used because they can be easily molded into a predetermined shape (see, for example, PTL 1). However, since resin light shielding plates have optical transparency, they allow external light to pass not only through their apertures for passing external light but also through parts defining the apertures. Thus, resin light shielding plates cannot sufficiently shield against light and for this reason metal light shielding plates having higher light shielding properties are beginning to be used (see, for example, PTL 2).

CITATION LIST

Patent Literature

[PTL 1] JP 2010-8786 A; [PTL 2] WO 2016/060198 A.

SUMMARY OF THE INVENTION

Technical Problem

When producing metal light shielding plates, punching, that is, processing in which metal plates are punched with dies, is used because this processing is not difficult technically and can produce many products per unit time. When processing a metal plate using punching, the metal plate is required to be punched in the direction perpendicular to the surface thereof to reduce the occurrence of deformation or strain in the metal plate when it is punched by the die and to thereby secure dimensional accuracy of the product. Thus, in a cross section perpendicular to the surface of the metal plate, the metal plate is provided with an aperture having a side surface extending perpendicularly to the surface of the metal plate.

If a light shielding plate having such an aperture is installed in a camera unit, external light that is incident on the light shielding plate in a direction forming an acute angle with the surface of the light shielding plate may be reflected at the side surface defining the aperture and may resultantly pass through the aperture. The light that has passed through the aperture is received by an imaging part provided to the camera unit and may cause ghosting and/or flare in the image captured by the imaging part. In this way, metal light shielding plates suffer from new issues due to the light shielding plates being made of metals.

The present invention aims to provide a light shielding plate capable of reducing the amount of light reflected at the side surface defining the aperture which is for light to pass therethrough, and to provide a camera unit, an electronic device, and a method of producing the light shielding plate.

Solution to Problem

A light shielding plate for solving the above issues is a light shielding plate made of metal and including a front surface located on a light incident side, a rear surface facing away from the front surface, and an aperture penetrating through the front surface and the rear surface. The aperture includes a first aperture portion and a second aperture portion connected to the first aperture portion via a central opening, the first aperture portion extending from a rear opening in the rear surface toward the central opening and having a shape tapered from the rear surface toward the front surface. The second aperture portion extends from the aperture in the front surface toward the central opening and has a shape tapered from the front surface toward the rear surface, the front opening being larger than the rear opening. The front opening is larger than the rear opening. In a cross section that is parallel to a plane perpendicular to the front surface, an angle between the rear surface and the line connecting between the edge of the central opening and the edge of the rear opening is larger than 90°.

A camera unit for solving the above issues includes the above light shielding plate.

An electronic device for solving the above issues includes the above camera unit.

A method of producing a light shielding plate for solving the above issue includes disposing a resist layer on each of a front surface and a rear surface of a metal foil, exposing and developing the resist layers to form a resist mask from each of the resist layers, forming, on the metal foil by using the resist mask formed on the rear surface, a first aperture portion having a rear opening on the rear surface and having a shape tapered from the rear surface toward the front surface, and after forming the first aperture portion, forming, on the metal foil by using the resist mask formed on the front surface, a second aperture portion so that the second aperture portion is connected to the first aperture portion, the second aperture portion having a front opening on the front surface and having a shape tapered from the front surface toward the rear surface. In the step of forming the first aperture portion and the step of forming the second aperture portion, the first aperture portion and the second aperture portion are formed so that in a cross section that is parallel to a plane perpendicular to the front surface, an angle between the rear surface and the line connecting between the edge of the central opening at which the second aperture portion is connected to the first aperture portion and the edge of the rear opening is larger than 90°.

With the above configurations, compared to the case where the angle between the rear surface and the line connecting between the edge of the central opening and the edge of the rear opening is larger than 90°, the amount of light reflected at the side surface defining the aperture can be reduced in the vicinity of the rear opening, of the light entering the aperture from obliquely above the front surface. Thus, the amount of light reflected at the side surface that defines the aperture 10H for light to pass therethrough can be further reduced.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

First Embodiment

Referring to FIGS. 1 to 9, a first embodiment for a light shielding plate, a camera unit, and an electronic device will be described. The following description is sequentially given of a light shielding plate, a method of producing the light shielding plate, and examples.

[Light Shielding Plate]

Referring to FIGS. 1 to 5, a light shielding plate will be described.

Figure 1:
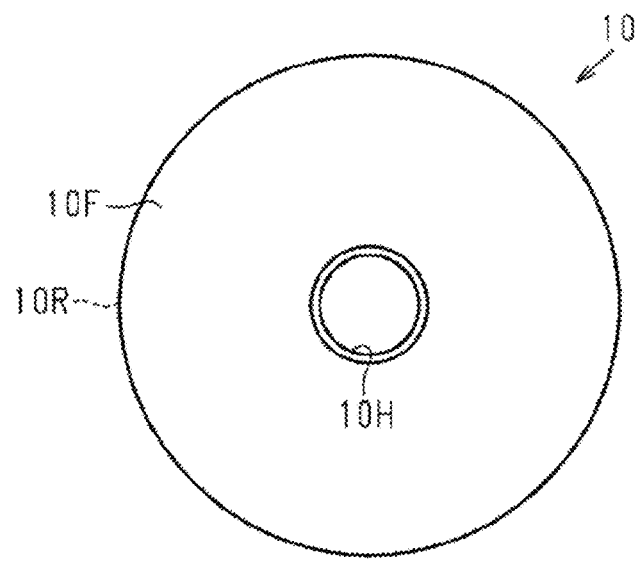
FIG. 1 is a plan view showing a structure of a light shielding plate of a first embodiment.

FIG. 1 shows a light shielding plate 10 made of metal including a front surface 10F, a rear surface 10R and an aperture 10H. The front surface 10F is a surface located on a light incident side. The rear surface 10R is a surface facing away from the front surface 10F. The aperture 10H penetrates through the front surface 10F and the rear surface 10R. The light shielding plate 10 may be made of stainless steel, for example, or may be made of metals other than stainless steel. It should be noted that, in the light shielding plate 10, the front surface 10F, the rear surface 10R, and a side surface defining the aperture 10H are covered with an antireflective film, not shown. The antireflective film has a reflectance lower than that of the metal forming the light shielding plate 10, and absorbs part of the light applied to the antireflective film. It should be noted that, even if the light shielding plate 10 is covered with the antireflective film, reflection of light at the light shielding plate 10 cannot be completely eliminated.

The light shielding plate 10 has a circular shape according to the shape of the lens that the light shielding plate 10 covers. The aperture 10H has a circular shape according to the shape of the lens the aperture 10H faces.

Figure 2:
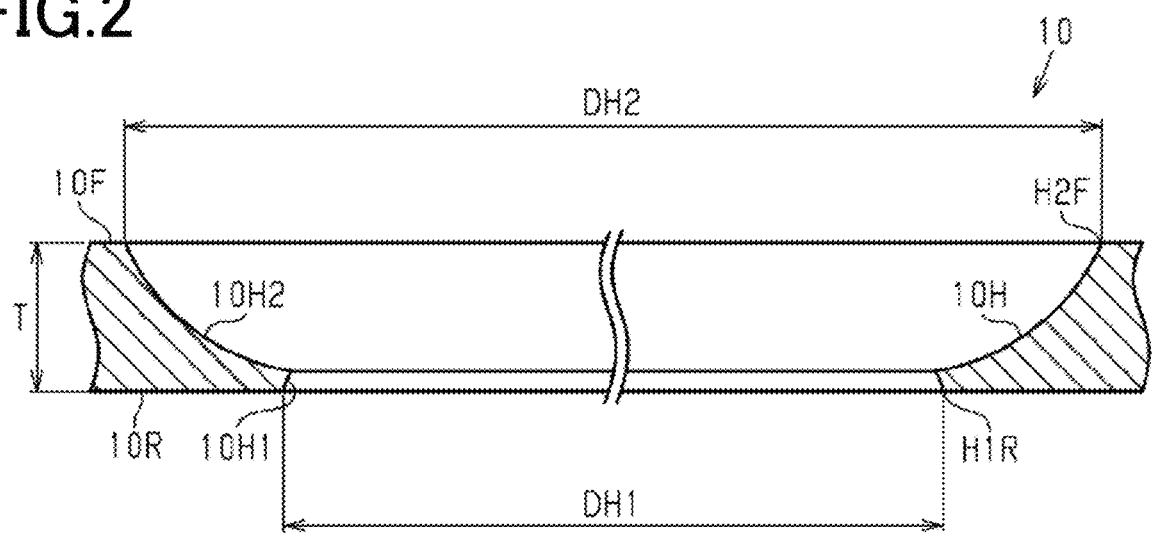
FIG. 2 is a cross-sectional view showing the structure of the light shielding plate shown in FIG. 1.

FIG. 2 shows a structure of the light shielding plate 10 in a cross section perpendicular to the front surface 10F of the light shielding plate 10.

As shown in FIG. 2, the aperture 10H includes a first aperture portion 10H1 and a second aperture portion 10H2. The first aperture portion 10H1 extends from a rear opening H1R in the rear surface 10R to a central opening HC (see FIG. 3). The first aperture portion 10H1 has a shape tapered from the rear surface 10R toward the front surface 10F. The second aperture portion 10H2 extends from a front opening H2F in the front surface 10F to the central opening HC. The second aperture portion 10H2 has a shape tapered from the front surface 10F toward the rear surface 10R. The front opening H2F is larger than the rear opening H1R. The second aperture portion 10H2 is connected to the first aperture portion 10H1 via the central opening HC. In other words, the central opening HC is located between the front surface 10F and the rear surface 10R in the thickness direction of the light shielding plate 10.

In the present embodiment, in a cross section that is parallel to a plane perpendicular to the front surface 10F, the side surface defining the second aperture portion 10H2 has an arc shape, with the center of curvature of this portion of the side surface located outside the light shielding plate 10. Also, in a cross section that is parallel to a plane perpendicular to the front surface 10F, the side surface defining the first aperture portion 10H1 has an arc shape, with the center of curvature of this portion of the side surface located outside the light shielding plate 10.

In the light shielding plate 10, the diameter of the first aperture portion 10H1 is a first diameter DH1, and the diameter of the second aperture portion 10H2 is a second diameter DH2. The first diameter DH1 is determined according to the camera unit in which the light shielding plate 10 is installed. When the light shielding plate 10 is installed in a camera unit of a smartphone, for example, the first diameter DH1 may be 0.4 mm or more and 1.0 mm or less. When the light shielding plate 10 is installed in an in-vehicle camera, for example, the first diameter DH1 may be 2.0 mm or more and 7.0 mm or less.

The percentage of the first diameter DH1 to the second diameter DH2 (DH1/DH2×100) may be, for example, 80% or more and 99% or less. When the light shielding plate 10 is installed in a camera unit which is mounted to a front surface of a smartphone, tablet type personal computer, or notebook type personal computer, the camera unit may often capture an image of a target at a short distance. Therefore, the light shielding plate 10 does not require a large inner diameter for the lens to focus the imaging target, although the angle of view may become large. Since the space for arranging such camera units is limited, it is difficult to increase the outer diameter of the light shielding plate 10. Therefore, the percentage of the first diameter DH1 to the second diameter DH2 may be 80% or more and 90% or less.

In contrast, if the light shielding plate 10 is installed in an in-vehicle camera, the in-vehicle camera may often capture an image of a target at a medium to long distance. Therefore, since there are fewer constraints on the space where such camera units are arranged, the diameter of the lens provided to the camera units becomes large, although the angle of view may become small. Thus, to collect a wide range of light to the lens, the ratio of the first diameter DH1 to the second diameter DH2 in the light shielding plate 10 may be 90% or more and 99% or less.

Furthermore, if the light shielding plate 10 is installed in a camera unit that is mounted to the rear surface of a smartphone, the camera unit may often capture an image of a target at a short to long distance. Therefore, to cope with the case where the angle of view is increased, the ratio of the first diameter DH1 to the second diameter DH2 may be 80% or more and 90% or less, and to cope with the case where the angle of view is decreased, the ratio of the first diameter DH1 to the second diameter DH2 may be 90% or more and 99% or less.

The light shielding plate 10 may have a thickness T of, for example, 10 μm or more and 100 μm or less. If the thickness T of the light shielding plate 10 is 10 μm or more, the shape of the light shielding plate 10 may be prevented from being affected by warpage of the metal foil for forming the light shielding plate 10. If the thickness T of the light shielding plate 10 is 100 μm or less, the accuracy of etching when forming the aperture 10H may be prevented from being lowered.

Figure 3:
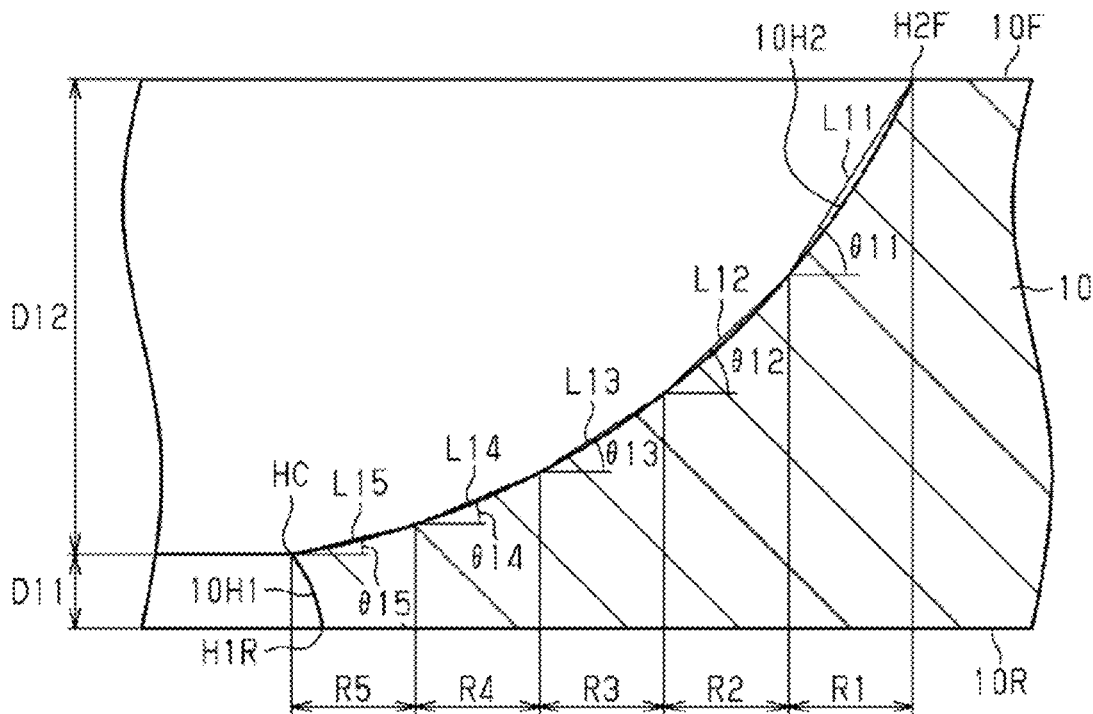
FIG. 3 is a partial enlarged cross-sectional view showing a part of the cross-sectional view in FIG. 2.

FIG. 3 shows, in an enlarged manner, part of the cross-sectional structure of the light shielding plate 10 shown in FIG. 2.

As shown in FIG. 3, the rear surface 10R of the light shielding plate 10 defines the rear opening H1R, and the first aperture portion 10H1 is connected to the second aperture portion 10H2 via the central opening HC. In the thickness direction of the light shielding plate 10, the distance between the rear surface 10R and the edge of the central opening HC is a first length D11. In the thickness direction of the light shielding plate 10, the distance between the front surface 10F and the edge of the central opening HC is a second length D12. In the light shielding plate 10, a ratio (D12/D11) of the second length D12 to the first length D11 is 2.5 or more.

As the ratio of the second length D12 to the first length D11 (D12/D11) increases, the central opening HC becomes relatively closer to the rear opening H1R. Thus, the area of the side surface defining the first aperture portion 10H1 can be reduced. Therefore, part of the light entering the aperture 10H from obliquely above the light shielding plate 10 and reflected at the surface of the lens is prevented from being incident on the first aperture portion 10H1 and from being reflected at the first aperture portion 10H1 toward the lens LN (see FIG. 4).

It should be noted that the ratio of the second length D12 to the first length D11 is preferred to approach infinity. However, practically, an etchant may permeate into the gap between the metal foil for forming the light shielding plate 10 and the mask formed on the metal foil in the process of etching for forming the aperture 10H, and this may form a first aperture portion 10H1 having a submicron depth, i.e., the first length D11. Therefore, for example, if the metal foil has a thickness of 100 μm, the lower limit of the first length D11 may be about 0.1 μm. Accordingly, the upper limit of the ratio (D12/D11) of the second length D12 to the first length D11 is approximately 1000.

As viewed perpendicularly to the front surface 10F, the front opening H2F has a circular shape. As viewed perpendicularly to the front surface 10F, the side surface defining the second aperture portion 10H2 is equally divided into five regions in the radial direction of the front opening H2F, with each region being concentric with the front opening H2F. In this case, as viewed perpendicularly to the front surface 10F, the side surface defining the second aperture portion 10H2 has a first region R1, second region R2, third region R3, fourth region R4 and fifth region R5 in a direction from the edge of the front opening H2F toward the edge of the central opening HC. It should be noted that, in the side surface defining the second aperture portion 10H2, the first region R1 is a region including the edge of the front opening H2F. In the side surface defining the second aperture portion 10H2, the fifth region R5 is a region including the edge of the central opening HC.

In a cross section that is parallel to a plane perpendicular to the front surface 10F, i.e., in a cross section that is parallel to a plane passing through the center of the front opening H2F, the inclination of the line, i.e., the inclination of the line segment, connecting between one end and the other end of a part of the side surface defining the second aperture portion 10H2, relative to the front surface 10F, is an inclination angle of the region in the part of the side surface. In the first region R1, the angle between a first line L11 and the front surface 10F is a first inclination angle 11. In the second region R2, the angle between a second line L12 and the front surface 10F is a second inclination angle $\theta12$. In the third region R3, the angle between a third line L13 and the front surface 10F is a third inclination angle $\theta13$. In the fourth region R4, the angle between a fourth line L14 and the front surface 10F is a fourth inclination angle $\theta14$. In the fifth region R5, the angle between a fifth line L15 and the front surface 10F is a fifth inclination angle θ15.

In a cross section that is parallel to a plane perpendicular to the front surface 10F, the first inclination angle 11 of the first region R1 in the side surface defining the second aperture portion 10H2 is larger than the inclination angles of other regions. In other words, the first inclination 11 of the first region R1 is the largest in the five regions. The first inclination angle θ11 is larger than any of the second, third, fourth and fifth inclination angles θ12, θ13, θ14 and θ15. The first inclination angle θ11 is 500 or more and 600 or less.

In a cross section that is parallel to a plane perpendicular to the front surface 10F, the fifth inclination angle θ15 of the fifth region R5 in the side surface defining the second aperture portion 10H2 is larger than the fourth inclination angle θ14. The inclination angles of the regions in the parts of the side surface defining the second aperture portion 10H2 become smaller from the first region R1 toward the fourth region R4. In other words, the inclination angles become smaller in order of the first, second, third and fourth inclination angles θ11, θ12, θ13 and θ14 in the side surface defining the second aperture portion 10H2.

Figure 4:
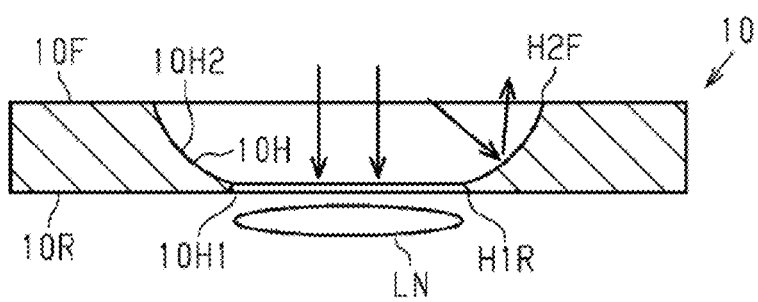
FIG. 4 is an operation diagram illustrating operation of the light shielding plate of the first embodiment.
Figure 5:
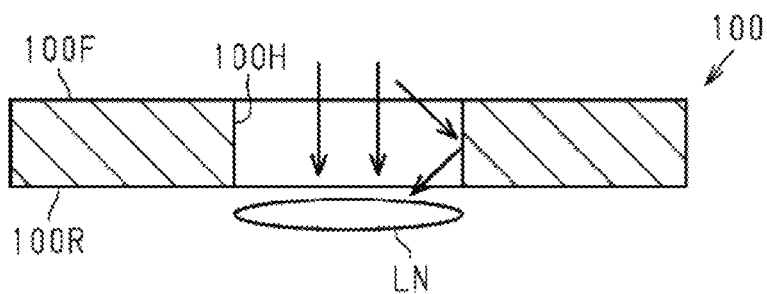
FIG. 5 is an operation diagram illustrating operation of the light shielding plate of the first embodiment.

FIG. 4 shows a cross-sectional structure of the light shielding plate 10 of the present embodiment. On the other hand, FIG. 5 shows a cross-sectional structure of an example as viewed from the plane perpendicular to the front surface, in which the side surface defining the aperture extends in the direction perpendicular to the front surface. It should be noted that, in FIGS. 4 and 5, the first diameter is made smaller relative to the thickness of the light shielding plate, for convenience of illustration.

As shown in FIG. 4, the light incident on the light shielding plate 10 in the direction perpendicular to the front surface 10F enters the aperture 10H from the front opening H2F formed in the front surface 10F. The light that has passed through the aperture 10H is outputted from the rear opening H1R formed in the rear surface 10R and reaches the lens LN. In the light shielding plate 10, since the second aperture portion 10H2 has a shape that is tapered from the front surface 10F toward the rear surface 10R, the light entering the aperture 10H from obliquely above the front surface 10F is likely to be reflected at the side surface defining the second aperture portion 10H2 toward the front surface 10F of the light shielding plate 10.

In addition, since the ratio of the second length D12 between the front surface 10F and the central opening HC to the first length D11 between the rear surface 10R and the central opening HC (D12/D11) is 2.5 or more, the size of the second aperture portion 10H2 can be maintained so that the shape thereof can be tapered from the front surface 10F toward the rear surface 10R. Thus, the amount of light reflected by the side surface that defines the aperture 10H for light to pass therethrough can be reduced. Consequently, unwanted light is prevented from being incident on the lens LN facing the light shielding plate 10.

In the present embodiment, the first inclination angle θ11 of the first region R1 is larger than the inclination angles of the second region R2 to the fifth region R5. Therefore, light can be more easily reflected at these regions other than the first region R1 toward the front surface 10F of the light shielding plate 10, while the diameter of the second aperture portion 10H2 is prevented from becoming excessively large. Since the first inclination angle θ11 is 500 or more and 60° or less, reliability can be enhanced more in reflecting light in the first region R1 including the front opening H2F toward the front surface 10F of the light shielding plate 10, in the side surface defining the second aperture portion 10H2.

In the present embodiment, the fifth inclination angle θ15 of the fifth region R5 is larger than the fourth inclination angle θ14 of the fourth region R4. Accordingly, the diameter of the second aperture portion 10H2 can be prevented from being increased compared to the case where the fifth inclination angle θ15 of the fifth region R5 is smaller than the fourth inclination angle θ14 of the fourth region R4. Furthermore, the inclination angles decrease from the first region R1 toward the fourth region R4. Accordingly, light that is incident on the second aperture portion 10H2 can be more easily reflected therefrom as the central opening HC becomes closer toward the front surface 10F of the light shielding plate 10, compared to the case where the inclination of the side surface defining the second aperture portion 10H2 is constant across the first to fourth regions R1 to R4.

Also, light that is incident on the second aperture portion 10H2 from obliquely above the front surface 10F is reflected at the side surface having an arc shape with the center of curvature located outside the light shielding plate 10. Accordingly, specular light having the highest brightness in the reflected light is reflected at the arc-shaped side surface in a direction toward the front surface 10F of the light shielding plate 10. Therefore, the amount of light reflected by the side surface that defines the aperture 10H for light to pass therethrough can be further reduced.

In the light shielding plate 10, the side surface defining the first aperture portion 10H1 has an arc shape having a center of curvature located outside the light shielding plate 10. Therefore, compared to the case where the side surface defining the first aperture portion 10H1 has a linear profile, the amount of light reflected at the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

As shown in FIG. 5, the light incident on a light shielding plate 100 in the direction perpendicular to a front surface 100F enters an aperture 100H from an opening formed in the front surface 100F, similarly to the light incident on the light shielding plate 10 in the direction perpendicular to the front surface 10F. The light that has passed through the aperture 100H is outputted from the opening formed in a rear surface 100R and reaches the lens LN. In contrast, part of the light incident on the front surface 100F from obliquely above the front surface 100F enters the aperture 100H from the opening formed in the front surface 100F and is reflected at the side surface defining the aperture 100H. Since almost all the light incident on the side surface is reflected in the specular direction, the light incident on the side surface is reflected thereon toward the lens LN. Thus, unwanted light is unavoidably incident on the imaging part through the lens LN.

The camera unit described above includes one or more light shielding plates 10. The camera unit including the light shielding plate 10 is mounted on various electronic devices. Examples of electronic devices including the camera unit include smartphones, tablet personal computers, and laptop personal computers.

[Method of Producing Light Shielding Plate]

Referring to FIGS. 6 to 9, a method of producing the light shielding plate 10 will be described. FIGS. 6 to 9 each show a cross-sectional structure of a metal foil in a specific step in the process of producing the light shielding plate 10. In FIGS. 6 to 9, for convenience of illustration, the ratio of the second diameter DH2 to the thickness of the metal foil is reduced compared to that in the actual light shielding plate, and the ratio of the first diameter DH1 to the thickness of the metal foil is reduced compared to that in the actual light shielding plate. For convenience of illustration, in FIGS. 6 to 9, the ratio of the first diameter DH1 to the second diameter DH2 is smaller than that of the actual light shielding plate. For convenience of description, FIGS. 6 to 9 show only the steps related to formation of the aperture 10H of the light shielding plate 10 in the process of producing the light shielding plate 10.

Figure 6:
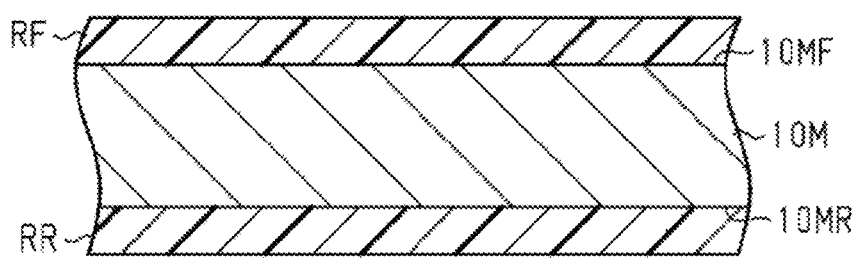
FIG. 6 is a process diagram illustrating a method of producing the light shielding plate of the first embodiment.

As shown in FIG. 6, when the light shielding plate 10 is formed, first, a metal foil 10M for forming the light shielding plate 10 is prepared. The metal foil 10M may be, for example, a stainless steel foil, but may be a metal foil made of other metal than stainless steel as mentioned above. The metal foil 10M may have a thickness of 10 μm or more and 100 μm or less. If the thickness of the metal foil 10M is 10 μm or more, the shape of the light shielding plate 10 may be prevented from being affected by warpage of the metal foil 10M. If the thickness of the metal foil 10M is 100 μm or less, the accuracy of etching when forming the aperture 10H may be prevented from being lowered. The thickness of the metal foil 10M is substantially the same as that of the light shielding plate 10 made from the metal foil 10M.

Then, a resist layer is disposed on a front surface 10MF and a rear surface 10MR of the metal foil 10M. The front surface 10MF of the metal foil 10M corresponds to the front surface 10F of the light shielding plate 10, and the rear surface 10MR of the metal foil 10M corresponds to the rear surface 10R of the light shielding plate 10. The front surface 10MF of the metal foil 10M is provided with a front resist layer RF, and the rear surface 10MR of the metal foil 10M is provided with a rear resist layer RR. It should be noted that a dry film resist may be adhered to both of the front and rear surfaces 10MF and 10MR as the resist layers RF and RR. Alternatively, a coating liquid for forming resist layers RF and RR may be applied to both of the front and rear surfaces 10MF and 10MR to form the resist layers RF and RR. The resist layers RF and RR may be made of a negative resist or a positive resist.

Figure 7:
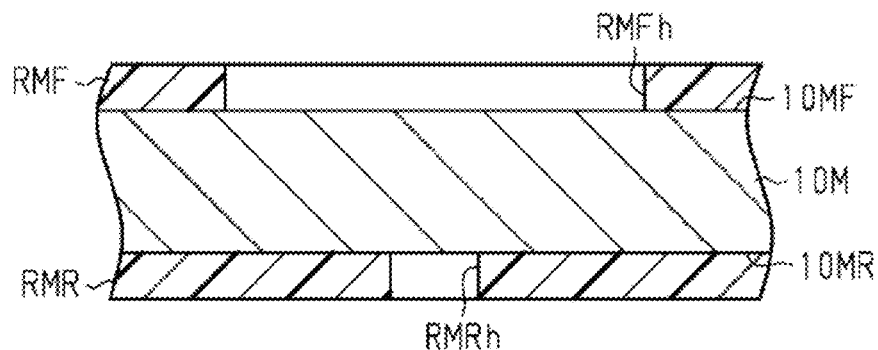
FIG. 7 is a process diagram illustrating the method of producing the light shielding plate of the first embodiment.

As shown in FIG. 7, the resist layers RF and RR are exposed and developed to form resist masks from the resist layers. More specifically, the front resist layer RF is exposed and developed to form a front mask RMF from the front resist layer RF. Furthermore, the rear surface resist layer RR is exposed and developed to form a rear mask RMR from the rear surface resist layer RR. The front mask RMF has a mask hole RMFh for forming a second aperture portion in the metal foil 10M. The rear mask RMR has a mask hole RMRh for forming a first aperture portion in the metal foil 10M.

Figure 8:
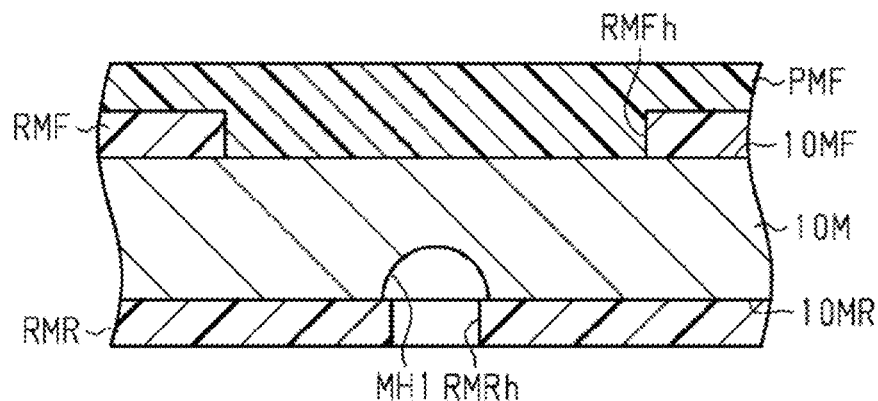
FIG. 8 is a process diagram illustrating the method of producing the light shielding plate of the first embodiment.

As shown in FIG. 8, the rear mask RMR formed on the rear surface 10MR is used to form a first aperture portion MH1 having a rear opening on the rear surface 10MR and having a shape tapered from the rear surface 10MR toward the front surface 10MF in the metal foil 10M. The first aperture portion MH1 corresponds to the first aperture portion 10H1 of the light shielding plate 10. At this time, the metal foil 10M is etched by using an etching solution capable of etching the metal foil 10M. Before etching the metal foil 10M, the front mask RMF is covered with a front protective film PMF that is resistant to the etching solution. The front protective film PMF may be filled in the mask hole RMFh of the front mask RMF, or may cover the mask hole RMFh of the front mask RMF. By covering the front mask RMF with the front protective film PMF, it is possible to prevent the front surface 10MF of the metal foil 10M from being etched together with the rear surface 10MR of the metal foil 10M.

If the first aperture portion MH1 is formed by etching of the rear surface 10MR, the first aperture portion MH1 as formed will have a depth larger than the distance between the rear surface 10R and the central opening HC of the light shielding plate 10 described above.

Figure 9:
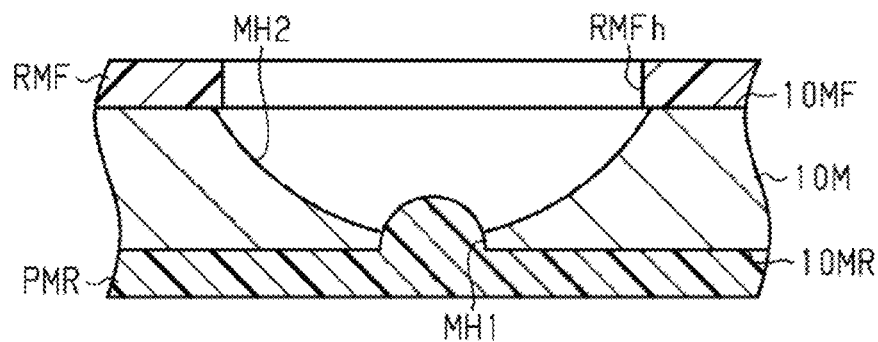
FIG. 9 is a process diagram illustrating the method of producing the light shielding plate of the first embodiment.

As shown in FIG. 9, after forming the first aperture portion MH1, using the front mask RMF formed on the front surface 10MF, a second aperture portion MH2 having a front opening in the front surface 10MF and tapered from the front surface 10MF toward the rear surface 10MR is formed in the metal foil 10M so as to be connected to the first aperture portion MH1. The second aperture portion MH2 corresponds to the second aperture portion 10H2 of the light shielding plate 10. In this case, as in the formation of the first aperture portion MH1, the metal foil 10M is etched using an etchant capable of etching the metal foil 10M. It should be noted that the rear mask RMR is removed from the rear surface 10MR of the metal foil 10M prior to etching the metal foil 10M.

Furthermore, before etching the metal foil 10M, the rear surface 10MR of the metal foil 10M is covered with a rear protective film PMR that is resistant to the etching solution, and the first aperture portion MH1 is filled with the rear protective film PMR. By covering the rear surface 10MR of the metal foil 10M with the rear protective film PMR, it is possible to prevent the rear surface 10MR of the metal foil 10M from being etched together with the front surface 10MF of the metal foil 10M.

To obtain the second aperture portion MH2 by etching, the front surface 10MF of the metal foil 10M is etched in a state in which the first aperture portion MH1 is filled with the rear protective film PMR. Therefore, after the etching of the front surface 10MF has reached the rear protective film PMR, supply of the etchant to the metal foil 10 is limited by the rear protective film PMR. Thus, if the thickness of the metal foil 10M is in a wide range of 10 μm or more and 100 μm or less, accuracy can be enhanced in the cross-sectional shape of the second aperture portion MH2. In contrast, if the first aperture portion MH1 were not filled with the rear protective film PMR and if the first and second aperture portions MH1 and MH2 were connected in this state to penetrate the metal foil 10M, the etchant might leak through the connected portion between the first and second aperture portions MH1 and MH2 toward the rear surface 10MR of the metal foil 10M. Consequently, accuracy may be lowered in the shapes of the first and second aperture portions MH1 and MH2.

After forming the first and second aperture portions MH1 and MH2, the front mask RMF is removed from the front surface 10MF and the rear protective film PMR is removed from the rear surface 10MR. Furthermore, after removal of the front mask RMF and the rear protective film PMR from the metal foil 10M, an antireflective film is formed covering the front surface 10MF, the rear surface 10MR, and the side surface defining the first and second aperture portions MH1 and MH2. As described above, the antireflective film has a reflectance lower than that of the metal foil 10M and absorbs part of the light incident on the antireflective film.

For example, the antireflective film may be a coating with a black color. The antireflection film may be formed on the metal foil 10M by using a film formation method such as a sputtering method or a vapor deposition method. Alternatively, the antireflective film may be formed on the metal foil 10M by having the metal foil 10M contact a liquid for forming an antireflective film.

Through such a method of producing the light shielding plate 10, there is produced a light shielding plate 10 in which one aperture 10H is formed and the ratio of the length between the front surface 10F and the edge of the central opening HC to the length between the rear surface 10R and the edge of the central opening HC is 2.5 or more in the thickness direction of the light shielding plate 10.

In the method of producing the light shielding plate 10 described above, the rear mask RMR does not have to be removed prior to forming the rear protective film PMR. In this case, a rear protective film PMR may be formed covering the rear mask RMR and filling the first aperture portion MH1. The rear protective film PMR may be removed from the rear surface 10MR together with the rear mask RMR after forming the second aperture portion MH2 by etching the front surface 10MF.

EXAMPLES

Examples and comparative examples will be described.

Example 1-1

A stainless steel foil having a thickness of 30 μm was prepared. The rear surface of the stainless steel foil was etched to form a first aperture portion, followed by etching the front surface to form a second aperture portion. Thus, a light shielding plate was obtained which included an aperture having a first aperture portion and a second aperture portion and had an elliptic central opening with a major axis diameter of 270 μm and a minor axis diameter of 75 km.

Example 1-2

A light shielding plate of Example 1-2 was obtained as in Example 1-1 except that the central opening was changed to have a circular shape with a diameter of 850 km.

Example 1-3

A light shielding plate of Example 1-3 was obtained as in Example 1-1 except that the central opening was changed to have a circular shape with a diameter of 490 km.

Example 1-4

A light shielding plate of Example 1-4 was obtained as in Example 1-1 except that the central opening was changed to have a circular shape with a diameter of 6,600 km.

Example 1-5

A light shielding plate of Example 1-5 was obtained as in Example 1-1 except that the central opening was changed to have a circular shape with a diameter of 2,510 km.

Example 1-6

A light shielding plate of Example 1-6 was obtained as in Example 1-3 except that the stainless steel foil was changed to have a thickness of 25 km.

Comparative Example 1-1

A light shielding plate of Comparative Example 1-1 was obtained as in Example 1-1 except that the stainless steel foil of Example 1-1 was punched with a die to form a circular aperture penetrating the stainless steel foil. It should be noted that, in the light shielding plate of Comparative Example 1-1, the diameter of the front opening was equal to the diameter of the rear opening, and these diameters were equal to the second diameter of Example 1-1.

[Evaluations]

In each of the light shielding plates of Examples 1-1 to 1-6 and Comparative Example 1-1, the profile of the first aperture portion was measured from a direction perpendicular to the front surface by using a confocal laser microscope (VK-X1000 Series, produced by Keyence Corporation). Furthermore, these light shielding plates were measured in terms of the profile of the first aperture portion in a direction perpendicular to the rear surface using a confocal laser microscope (the same as above). Then, the ratio of the second length D12 to the first length D11 (D12/D11) was calculated based on the profiles of the first and second aperture portions. The ratio of the second length D12 to the first length D11 was as shown in the following Table 1. Table 1 does not include the ratio of the second length D12 to the first length D11 of Comparative Example 1-1 because, as mentioned above, the light shielding plate of Comparative Example 1-1 did not have an aperture having a first aperture portion and a second aperture portion.

TABLE 1

| | D2/D1 |
|---|---|
| Example 1-1 | 3.84 |
| Example 1-2 | 3.35 |
| Example 1-3 | 2.61 |
| Example 1-4 | 2.90 |
| Example 1-5 | 2.57 |
| Example 1-6 | 84.65 |

As shown in Table 1, the ratio of the second length D12 to the first length D11 was 3.84 in Example 1-1, 3.35 in Example 1-2, and 2.61 in Example 1-3. Furthermore, the ratio of the second length D12 to the first length D11 was 2.90 in Example 1-4, 2.57 in Example 1-5, and 84.65 in Example 1-6. Thus, the ratio of the second length D12 to the first length D11 was 2.5 or more in all of the examples.

Also, in the image of each light shielding plate, the side surface of the second aperture portion was equally divided into five regions in the radial direction of the front opening, based on the profile of the second aperture portion to calculate an inclination angle of each region. The calculation results were as shown in Tables 2 and 3. In Tables 2 and 3, the horizontal length refers to the length of each region in the radial direction of the front opening. Also, in Tables 2 and 3, the height difference refers to the difference in height between one end position and the other end position in each region.

TABLE 2

| | Example 1-1 | | | Example 1-2 | | | Example 1-3 | | |
|---|---|---|---|---|---|---|---|---|---|
| | Horizontal distance (μm) | Height difference (μm) | Inclination angle (°) | Horizontal distance (μm) | Height difference (μm) | Inclination angle (°) | Horizontal distance (μm) | Height difference (μm) | Inclination angle (°) |
| First region | 6.5 | 10.7 | 58.7 | 9.5 | 11.4 | 50.2 | 8.1 | 11.0 | 53.6 |
| Second region | 6.7 | 4.9 | 36.2 | 9.5 | 4.3 | 24.6 | 8.1 | 4.0 | 26.5 |
| Third region | 6.5 | 3.0 | 24.8 | 9.6 | 2.8 | 16.0 | 8.1 | 2.5 | 17.2 |
| Fourth region | 6.7 | 2.6 | 21.3 | 9.6 | 1.9 | 10.9 | 8.1 | 1.9 | 13.3 |
| Fifth region | 6.7 | 2.6 | 21.4 | 9.5 | 2.7 | 15.8 | 8.1 | 2.3 | 15.8 |

TABLE 3

| | Example 1-4 | | | Example 1-5 | | | Example 1-6 | | |
|---|---|---|---|---|---|---|---|---|---|
| | Horizontal distance (μm) | Height difference (μm) | Inclination angle (°) | Horizontal distance (μm) | Height difference (μm) | Inclination angle (°) | Horizontal distance (μm) | Height difference (μm) | Inclination angle (°) |
| First region | 7.2 | 10.9 | 56.8 | 6.9 | 10.3 | 56.2 | 7.7 | 11.0 | 54.7 |
| Second region | 7.2 | 4.1 | 29.9 | 7.1 | 4.1 | 30.2 | 7.7 | 4.6 | 31.0 |
| Third region | 7.2 | 2.8 | 21.4 | 6.9 | 2.4 | 19.0 | 7.6 | 2.9 | 21.0 |
| Fourth region | 7.2 | 2.0 | 15.6 | 7.1 | 2.0 | 16.2 | 7.7 | 2.3 | 16.5 |
| Fifth region | 7.2 | 2.5 | 19.2 | 7.1 | 2.8 | 21.5 | 7.7 | 2.4 | 17.5 |

As shown in Tables 2 and 3, in Example 1-1, the side surface defining the second aperture portion was equally divided into five regions in the radial direction of the front opening with the horizontal length of each region set to 6.5 μm or 6.7 μm. In Example 1-2, the side surface defining the second aperture portion was equally divided into five regions in the radial direction of the front opening with the horizontal length of each region set to 9.5 μm or 9.6 μm. In Example 1-3, the side surface defining the second aperture portion was equally divided into five regions in the radial direction of the front opening with the horizontal length of each region set to 8.1 μm, and in Example 1-4, with the horizontal length of each region set to 7.2 μm. In Example 1-5, the side surface defining the second aperture portion was equally divided into five regions in the radial direction of the front opening with the horizontal length of each region set to 6.9 μm or 7.1 μm. In Example 1-6, the side surface defining the second aperture portion was equally divided into five regions in the radial direction of the front opening with the horizontal length of each region set to 7.7 μm or 7.6 μm.

As shown in Tables 2 and 3, in all of Examples 1-1 to 1-6, the first inclination angle θ11 of the first region was the largest of the first to fifth regions, and was 50° or more and 600 or less. Furthermore, in all of Examples 1-1 to 1-6, the inclination angles sequentially became smaller from the first to fourth inclination angles θ11 to θ14, and the fifth inclination angle θ15 was larger than the fourth inclination angle θ14.

An image of the same object was captured in the same environment by a camera unit including each of the light shielding plates. In the images captured by the camera unit including the light shielding plate of each of Examples 1-1 to 1-6, almost no ghosting or flare was observed. Thus, it was found that when the ratio (D12/D11) of the second length D12 to the first length D11 was 2.5 or more, ghost and flare were prevented. Particularly in Example 1-6, ghosting and flare were further prevented as compared with Examples 1-1 to 1-5. This is considered to be because Example 1-6, in which the area of the side surface defining the first aperture portion was much smaller than in Examples 1-1 to 1-5, could significantly prevent part of light incident on the lens from being reflected at the surface of the lens and entering the first aperture portion and being further reflected at the first aperture portion toward the lens. On the other hand, in the image captured by the camera unit including the light shielding plate of Comparative Example 1-1, ghosting and flare were observed.

As described above, according to the first embodiment of the light shielding plate, the camera unit, and the electronic device, the following effects can be obtained.

(1-1) Since in the light shielding plate 10, the second aperture portion 10H2 has a shape tapered from the front surface 10F toward the rear surface 10R, light entering the aperture 10H from obliquely above the front surface 10F is easily reflected by the side surface defining the first aperture portion 10H1 toward the front surface 10F of the light shielding plate 10.

(1-2) Since the ratio of the second length D12 between the front surface 10F and the central opening HC to the first length D11 between the rear surface 10R and the central opening HC (D12/D11) is 2.5 or more, the size of the second aperture portion 10H2 can be maintained so that the shape thereof can be tapered from the front surface 10F toward the rear surface 10R. Thus, the amount of light reflected by the side surface that defines the aperture 10H for light to pass therethrough can be reduced.

(1-3) If the first inclination angle θ11 of the first region R1 is larger than the inclination angles of the second to fifth regions R2 to R5, light can be more easily reflected at the regions other than the first region R1 toward the front surface 10F of the light shielding plate 10, while the diameter of the second aperture portion 10H2 can be prevented from becoming excessively large.

(1-4) If the first inclination angle θ11 is 500 or more and 60° or less, reliability can be enhanced more in reflecting light at the first region R1 including the front opening H2F toward the front surface 10F of the light shielding plate 10, in the side surface defining the second aperture portion 10H2.

(1-5) If the fifth inclination angle θ15 of the fifth region R5 is larger than the fourth inclination angle θ14 of the fourth region R4, the diameter of the second aperture portion 10H2 can be prevented from increasing compared to the case where the fifth inclination angle θ15 of the fifth region R5 is smaller than the fourth inclination angle θ14 of the fourth region R4.

(1-6) If the inclination angles decrease from the first region R1 toward the fourth region R4, light that is incident on the second aperture portion 10H2 can be easily reflected thereon as the central opening HC becomes closer toward the front surface 10F of the light shielding plate 10.

(1-7) If the side surface defining the second aperture portion 10H2 has an arc shape with the center of curvature located outside the light shielding plate 10, specular light having the highest brightness in the reflected light can be reflected at the arc-shaped side surface in a direction toward the front surface 10F of the light shielding plate 10.

(1-8) If the side surface defining the first aperture portion 10H1 has an arc shape with the center of curvature located outside the light shielding plate 10, the amount of light reflected at the side surface defining the aperture 10H can be reduced in the vicinity of the rear opening H1R, in the light entering the aperture from obliquely above the front surface 10F.

The first embodiment described above can be modified and implemented as follows.

[First Aperture Portion]

The side surface defining the first aperture portion 10H1 may have a linear profile in a cross section that is parallel to a plane perpendicular to the front surface 10F. In this case as well, advantageous effects similar to the above (1-1) can be achieved if the first aperture portion 10H1 has a shape tapered from the rear surface 10R toward the front surface 10F, the second aperture portion 10H2 has a shape tapered from the front surface 10F toward the rear surface 10R, and the ratio of the second length D12 to the first length D11 is 2.5 or more.

[Second Aperture Portion]

The side surface defining the second aperture portion 10H2 may have a linear shape in a cross section that is parallel to the plane perpendicular to the front surface 10F. In this case as well, advantageous effects similar to the above (1-1) can be achieved if the first aperture portion 10H1 has a shape tapered from the rear surface 10R toward the front surface 10F, the second aperture portion 10H2 has a shape tapered from the front surface 10F toward the rear surface 10R, and the ratio of the second length D12 to the first length D11 is 2.5 or more.

[Side Surface Defining Second Aperture Portion]

The inclination angle of each of the regions may be sequentially reduced from the first region R1 toward the fifth region R5. In this case as well, when the ratio of the second length D12 to the first length D11 is 2.5 or more, an effect similar to the effect (1-1) can be obtained.

The inclination angle of each of the regions may not be necessarily sequentially reduced from the first region R1 toward the fourth region R4. For example, the inclination angle of one of the first region R1 to the fourth region R4 may be equal to the inclination angle of another one of the first region R1 to the fourth region R4. In this case as well, when the ratio of the second length D12 to the first length D11 is 2.5 or more, an effect similar to the effect (1-1) can be obtained.

The fifth inclination angle θ15 of the fifth region R5 may be smaller than the fourth inclination angle θ14 of the fourth region R4. In this case as well, when the ratio of the second length D12 to the first length D11 is 2.5 or more, an effect similar to the effect (1-1) can be obtained.

The first inclination angle θ11 of the first region R1 may be smaller than 50°, or may be larger than 60°. In this case as well, when the ratio of the second length D12 to the first length D11 is 2.5 or more, an effect similar to the effect (1-1) can be obtained.

The first inclination angle θ11 of the first region R1 may be smaller than the inclination angle of at least one of the second region R2 to the fifth region R5. In this case as well, when the ratio of the second length D12 to the first length D11 is 2.5 or more, an effect similar to the effect (1-1) can be obtained.

[Light Shielding Plate]

The light shielding plate 10 may be made of a metal other than stainless steel as described above. The light shielding plate 10 may be made of, for example, an iron-nickel alloy or an iron-nickel-cobalt alloy.

Iron-nickel alloys have a smaller thermal expansion coefficient than stainless steel. Accordingly, in the light shielding plate made of an iron-nickel alloy, the amount of deformation due to a change in the outside air temperature is small; thus, it is possible to prevent a change in the amount of incident external light due to a change in the outside air temperature that is caused by warpage of the light shielding plate or a change in the inner diameter of the light shielding plate due to thermal expansion and thermal contraction. The amount of incident external light refers to the amount of external light incident on the lens through the light shielding plate 10. Thus, the use of an iron-nickel alloy to form the light shielding plate 10 is effective to prevent the occurrence of ghost and flare due to a change in the amount of incident external light.

An iron-nickel alloy is an alloy containing iron and nickel as main components and containing, for example, 30 mass % or more of nickel, and iron as the balance. Of iron-nickel alloys, an alloy containing 36 mass % of nickel, i.e., Invar, is preferable as a material for forming the light shielding plate 10. In Invar containing 36 mass % of nickel, the balance may contain an additive other than iron as the main component. Examples of the additive include chromium, manganese, carbon, and cobalt. The additive contained in the iron-nickel alloy is 1 mass % or less at the maximum.

Iron-nickel-cobalt alloys have a smaller thermal expansion coefficient than iron-nickel alloys. Accordingly, in the light shielding plate made of an iron-nickel-cobalt alloy, the amount of deformation due to a change in the outside air temperature is smaller; thus, it is possible to further prevent a change in the amount of incident external light due to a change in the outside air temperature that is caused by warpage of the light shielding plate or a change in the inner diameter of the light shielding plate due to thermal expansion and thermal contraction. Thus, the use of an iron-nickelcobalt alloy to form the light shielding plate 10 is further effective to prevent the occurrence of ghost and flare due to a change in the amount of incident external light.

An iron-nickel-cobalt alloy is an alloy containing iron, nickel, and cobalt as main components and containing, for example, 30 mass % or more of nickel, 3 mass % or more of cobalt, and iron as the balance. Of iron-nickel-cobalt alloys, an alloy containing 32 mass % of nickel and 4 mass % or more and 5 mass % or less of cobalt, i.e., Super Invar, is preferable as a material for forming the light shielding plate 10. In Super Invar containing 32 mass % of nickel and 4 mass % or more and 5 mass % or less of cobalt, the balance may contain an additive other than iron as the main component. Examples of the additive include chromium, manganese, and carbon. The additive contained in the iron-nickel-cobalt alloy is 0.5 mass % or less at the maximum.

Thus, when the light shielding plate 10 is made of an iron-nickel alloy or an iron-nickel-cobalt alloy, the following effect can be obtained.

(1-9) It is possible to prevent deformation of the light shielding plate 10 due to a change in the outside air temperature, thereby preventing a change in the amount of incident external light due to a change in the outside air temperature. This makes it possible to prevent the occurrence of ghost and flare due to a change in the amount of incident external light.

Second Embodiment

A second embodiment of the light shielding plate, the camera unit, and the electronic device will be described with reference to FIGS. 10 and 11. The second embodiment differs from the first embodiment described above in the shape of the light shielding plate. Thus, in the following, such a difference will be described in detail, and description of other portions will be omitted. In the following, the light shielding plate and examples will be described in this order.

[Light Shielding Plate]

The light shielding plate will be described with reference to FIG. 10.

Figure 10:
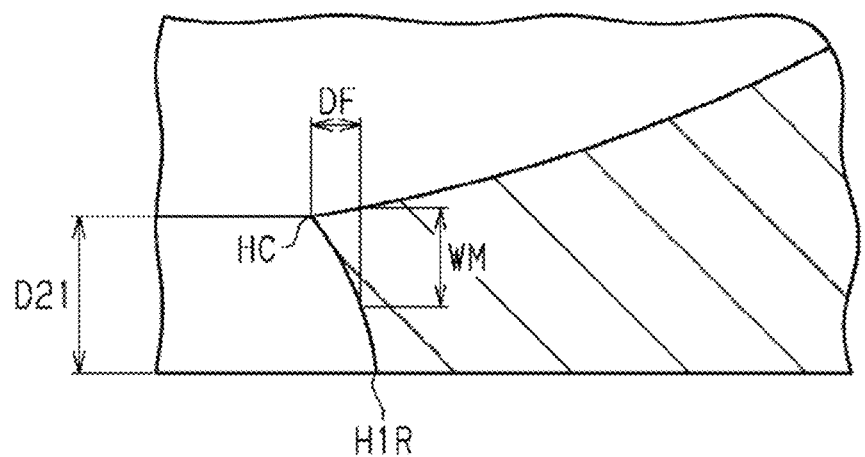
FIG. 10 is a partial enlarged cross-sectional view showing a part of a cross-section of a light shielding plate of a second embodiment.

FIG. 10 shows an enlarged portion of the cross-sectional structure of the light shielding plate 10 shown in FIG. 2.

When an image of the edge of the central opening HC is captured in the radial direction thereof by bringing the edge into focus under imaging conditions where the depth of field is 0.4 μm, as shown in FIG. 10, the maximum length of the light shielding plate 10 that can be in focus in the thickness direction thereof is referred to as a maximum focusable length WM. Specifically, the maximum focusable length WM is a thickness of the light shielding plate 10 at a position away from the edge of the central opening HC by a distance corresponding to a depth of field DF in the direction perpendicular to the thickness direction of the light shielding plate 10.

The maximum focusable length WM is 7.0 μm or less. Also, the maximum focusable length WM is 30% or less the thickness T of the light shielding plate 10. The maximum focusable length WM may be 3.0 μm or less. Also, the maximum focusable length WM may be 1.0 μm or more. The maximum focusable length WM may only satisfy either the condition of 7.0 μm or less or the condition of 30% or less the thickness T of the light shielding plate 10, and it does not necessarily have to satisfy both.

In the thickness direction of the light shielding plate 10, the distance between the rear surface 10R and the edge of the central opening HC is an aperture length D21. The aperture length D21 may be more than 0 μm and 3 μm or less. Alternatively, the aperture length D21 may be 30% or less the thickness of the light shielding plate 10. The aperture length D21 may satisfy the condition of 30% or less the thickness of the light shielding plate 10, and it does not necessarily have to satisfy the condition of 3 μm or less. The aperture length D21 may be smaller than the maximum focusable length WM or may be substantially equal to the maximum focusable length WM.

Light entering the light shielding plate 10 from a direction perpendicular to the front surface 10F enters the aperture 10H from the front opening H2F formed on the front surface 10F. The light that has passed through the aperture 10H is outputted from the rear opening H1R formed in the rear surface 10R and reaches the lens LN. In the light shielding plate 10, since the second aperture portion 10H2 has a shape that is tapered from the front surface 10F toward the rear surface 10R, the light entering the aperture 10H from obliquely above the front surface 10F is likely to be reflected at the side surface defining the second aperture portion 10H2 toward the front surface 10F of the light shielding plate 10.

Furthermore, since the maximum focusable length WM is 7.0 μm or less or 30% or less the thickness T of the light shielding plate 10, the area of the side surface defining the aperture 10H can be reduced in the vicinity of the central opening HC, and resultantly the amount of light reflected by the side surface defining the aperture 10H can be reduced in the vicinity of the central opening HC. Consequently, the amount of light reflected by the side surface that defines the aperture 10H for light to pass therethrough can be reduced. If the maximum focusable length WM is 3.0 μm or less, the area of the side surface defining the aperture can be further reduced in the vicinity of the central opening HC, and resultantly the amount of light reflected by the side surface defining the aperture 10H can be further reduced in the vicinity of the central opening HC.

Also, if the maximum focusable length WM is 1.0 μm or more, the portion of the light shielding plate 10 including the central opening HC will have a thickness of 1.0 μm or more and thus deformation in the vicinity of the central opening HC can be minimized. Accordingly, the amount of light passing through the light shielding plate 10 via the central hole HC is prevented from being varied due to deformation of the light shielding plate 10.

Furthermore, if the aperture length D21 is more than 0 μm and 3 μm or less or 30% or less the thickness of the light shielding plate 10, the area of the side surface defining the first aperture portion 10H1 can be reduced, so that the amount of light reflected at the side surface defining the first aperture portion 10H1 can be reduced. Consequently, the amount of light reflected at the side surface that defines the aperture 10H for light to pass therethrough can be reduced.

EXAMPLES

Examples and comparative examples will be described with reference to FIG. 11.

Example 2-1

A stainless steel foil having a thickness of 25 μm was prepared. The rear surface of the stainless steel foil was etched to form a first aperture portion, followed by etching the front surface to form a second aperture portion. Thus, a light shielding plate having an aperture defined by the first aperture portion and the second aperture portion was obtained.

Example 2-2

A light shielding plate of Example 2-1 was obtained as in Example 2-1 except that the second diameter of the front opening of the second aperture portion was increased.

Example 2-3

A light shielding plate of Example 2-3 was obtained as in Example 2-2 except that the second diameter of the front opening of the second aperture portion was decreased.

Comparative Example 2-1

A light shielding plate of Comparative Example 2-1 was obtained as in Example 2-1 except that the stainless steel foil was punched with a die to form a circular aperture penetrating the stainless steel foil. It should be noted that, in the light shielding plate of Comparative Example 2-1, the diameter of the front opening was equal to the diameter of the rear opening, and these diameters were equal to the second diameter of Example 2-1.

[Evaluations]

The maximum focusable length WM of the light shielding plates of Examples 2-1 to 2-3 and Comparative Example 2-1 was measured using a confocal laser microscope (VK-X1000 Series manufactured by Keyence Corporation). In this case, an objective lens with 50-fold magnification was mounted to the confocal laser microscope. A maximum focusable length WM was measured by observing the side surface defining the aperture in the direction perpendicular to the side surface and bringing the edge of the central opening into focus using the confocal laser microscope. In the confocal laser microscope, the range in which an object is in focus, i.e., the depth of field, varies depending on the magnification of the objective lens. Since an object can be in focus in the field of depth, the maximum focusable length of the light shielding plate in the thickness direction thereof depends on the position from the edge of the central opening. Accordingly, practically, the light shielding plate has a predetermined focusable length at a focus matching position. Objective lenses with 50-fold magnification have a field of depth of 0.4 µm. Therefore, the maximum focusable length was defined to be a maximum length of the light shielding plate in the thickness direction thereof in a state where the edge of the central opening was in focus with the field of depth being 0.4 µm. In other words, the thickness of the light shielding plate at a position away from the edge of the central opening by the field of depth is the maximum focusable length WM of the light shielding plate. Measurements of the maximum focusable length WM were as shown in Table 4.

Each of the light shielding plates of Examples 2-1 to 2-3 and Comparative Example 2-1 was cut parallel to a plane perpendicular to the front surface to form a measurement target. FIG. 11 shows the results obtained by capturing an image of the measurement target of Example 2-1 using a scanning electron microscope. The aperture length if Examples 2-1 to 2-3 and Comparative Example 2-1 was measured. The measurements were as shown in Table 4. Since the aperture of the light shielding plate of Comparative Example 2-1 had none of the first aperture portion, second aperture portion and central opening, there is no indication of maximum focusable length and aperture length.

TABLE 4

|  | Maximum width WM (µm) | Opening distance D (µm) | Ghost Flare |
|---|---|---|---|
| Example 2-1 | 2.3 | 0.27 | Very good |
| Example 2-2 | 0.6 | 0.10 | Good |
| Example 2-3 | 6.96 | 7.05 | Fair |
| Comparative Example 2-1 | — | — | Poor |

As shown in Table 4, the maximum focusable length WM of Example 2-1 was 2.3 m, that of Example 2-2 was 0.6 µm, and that of Example 2-3 was 6.96 µm. Thus, in all of Examples 2-1 to 2-3, the maximum focusable length WM was 7.0 µm or less. As shown in Table 4, the aperture length D21 of Example 2-1 was 0.27 µm, that of Example 2-2 was 0.10 µm, and that of Example 2-3 was 7.05 µm.

Figure 11:
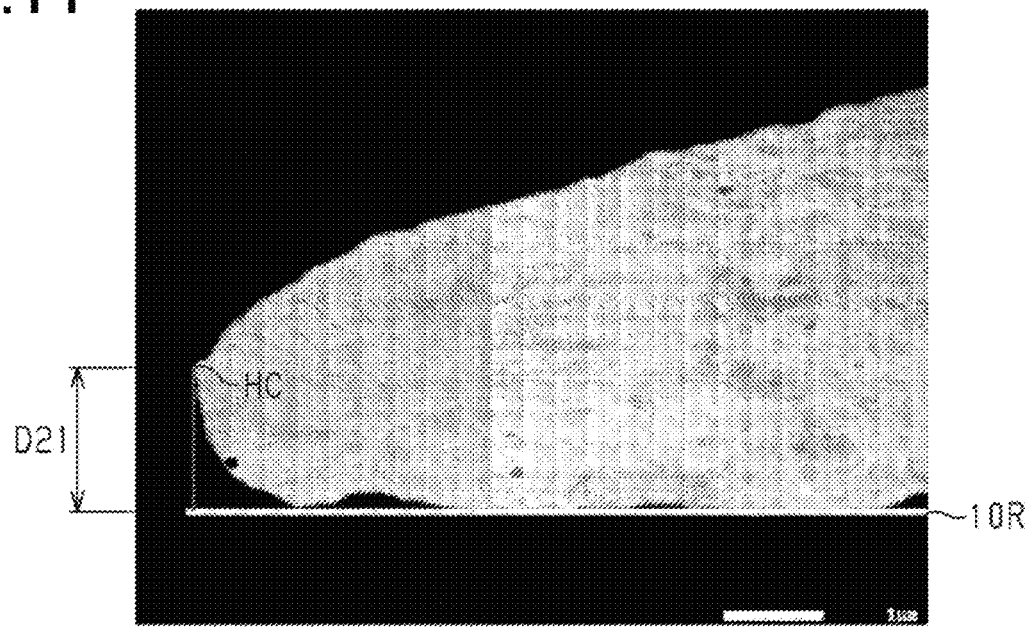
FIG. 11 is an image of a cross-sectional structure of a light shielding plate of Example 2-1.

As shown in FIG. 11, in the light shielding plate of Example 2-1, the first aperture portion had the rear opening H1R and the central opening HC. The light shielding plate of Example 2-2 and the light shielding plate of Example 2-3 also had an aperture having a shape similar to the shape of the aperture of the light shielding plate of Example 2-1.

Before the measurement targets were formed from the light shielding plates, an image of the same object was captured in the same environment by a camera unit including each of the light shielding plates. The images captured by the camera unit were evaluated according to the following criteria.

Excellent: No ghosting occurred, and substantially no flare occurred.

Good: No ghost occurred, and flare occurred to the extent that the contrast of the image was not significantly reduced.

Fair: Ghost occurred in only part of the image, and flare occurred to the extent that the contrast of the image was not significantly reduced.

Poor: Ghost occurred over a wide area of the image, and flare occurred to the extent that the contrast of the image was significantly reduced.

As shown in Table 4, the evaluation result was "Excellent" when the light shielding plate of Example 2-1 was used, the evaluation result was "Good" when the light shielding plate of Example 2-2 was used, and the evaluation result was "Fair" when the light shielding plate of Example 2-3 was used. As shown in Table 4, the evaluation result was "Poor" when the light shielding plate of Comparative Example 2-1 was used.

Thus, it was found that according to Examples 2-1 to 2-3, ghost and flare were reduced as compared with Comparative Example 2-1. Accordingly, it can be said that Examples 2-1 to 2-3 can reduce the amount of light reflected by the side surface that defines the aperture of the light shielding plate for light to pass therethrough. Example 2-3 can reduce the amount of light reflected by the side surface that defines the aperture of the light shielding plate for light to pass therethrough compared to Comparative Example 2-1, but causes ghosting and flare. Therefore, it can be said that the maximum focusable length WM is preferred to be 7.0 µm or less. Also, it is considered that Example 2-2 can reduce the amount of light reflected by the side surface that defines the aperture of the light shielding plate for light to pass therethrough compared to Comparative Example 2-1; however, when compared to Example 2-1, Example 2-2 reflects larger amount of light at the side surface that defines the aperture of the light shielding plate for light to pass therethrough. Such a difference in the amount of light is considered to be due to deformation of the light shielding plate which occurs due to lowering of the strength therein. Therefore, the maximum focusable length WM may preferably be 1.0 μm or more to minimize deformation of the light shielding plate.

As described above, according to the second embodiment of the light shielding plate, the camera unit, and the electronic device, the following effects can be obtained.

(2-1) With the maximum focusable length WM being 7.0 μm or less, the area of the side surface defining the aperture 10H can be reduced in the vicinity of the central opening HC, and resultantly the amount of light reflected by the side surface defining the aperture 10H can be reduced in the vicinity of the central opening HC. Consequently, the amount of light reflected by the side surface that defines the aperture 10H for light to pass therethrough can be reduced.

(2-2) With the maximum focusable length WM being 3.0 μm or less, the amount of light reflected by the side surface defining the aperture 10H can be further reduced in the vicinity of the central opening HC. Consequently, the amount of light reflected by the side surface that defines the aperture 10H for light to pass therethrough can be further reduced.

(2-3) With the maximum focusable length WM being 1.0 μm or more, deformation can be reduced or prevented in the vicinity of the central opening HC. Accordingly, the amount of light passing through the light shielding plate 10 via the central hole HC is prevented from being varied due to deformation of the light shielding plate 10.

(2-4) With the aperture length D21 being 3.0 μm or less, the area of the side surface defining the first aperture portion 10H1 can be reduced, so that the amount of light reflected by the side surface defining the first aperture portion 10H1 can be reduced. Consequently, the amount of light reflected by the side surface that defines the aperture 10H for light to pass therethrough can be reduced.

(2-5) With the aperture length D21 being 30% or less the thickness of the light shielding plate 10, the area of the side surface defining the first aperture portion 10H1 can be reduced, so that the amount of light reflected by the side surface defining the first aperture portion 10H can be reduced. Consequently, the amount of light reflected by the side surface that defines the aperture 10H for light to pass therethrough can be reduced.

(2-6) With the maximum focusable length WM being 30% or less the thickness of the light shielding plate 10, the area of the side surface defining the aperture 10H can be reduced in the vicinity of the central opening HC, so that the amount of light reflected by the side surface defining the aperture 10H can be reduced in the vicinity of the central opening HC. Consequently, the amount of light reflected by the side surface that defines the aperture 10H for light to pass therethrough can be reduced.

The second embodiment described above may be modified and implemented as follows.

[Aperture Length]

The aperture length D21 may be more than 3 μm. In this case as well, advantageous effects similar to the above (2-1) can be achieved if the maximum focusable length WM is 7.0 μm or less. Also, in this case as well, advantageous effects similar to the above (2-6) can be achieved if the maximum focusable length WM is 30% or less the thickness of the light shielding plate 10.

The aperture length D21 may be more than 30% the thickness of the light shielding plate 10. In this case as well, advantageous effects similar to the above (2-1) can be achieved if the maximum focusable length WM is 7.0 μm or less. Also, in this case as well, advantageous effects similar to the above (2-6) can be achieved if the maximum focusable length WM is 30% or less the thickness of the light shielding plate 10.

[Maximum Focusable Length]

The maximum focusable length WM may be more than 0 μm and less than 1 μm. In this case as well, advantageous effects similar to the above (2-1) can be achieved if the maximum focusable length WM is 7.0 μm or less. Also, in this case as well, advantageous effects similar to the above (2-6) can be achieved if the maximum focusable length WM is 30% or less the thickness of the light shielding plate 10.

The maximum focusable length WM may be more than 3.0 μm and 7.0 μm or less. In this case as well, an effect similar to the effect (2-1) can be obtained.

[First Aperture Portion]

When the first aperture portion 10H1 has a shape tapered from the rear surface 10R toward the front surface 10F, the side surface defining the first aperture portion 10H1 may have a linear shape in a cross section that is parallel to the plane perpendicular to the front surface 10F.

[Second Aperture Portion]

When the second aperture portion 10H2 has a shape tapered from the front surface 10F toward the rear surface 10R, the side surface defining the second aperture portion 10H2 may have a linear shape in a cross section that is parallel to the plane perpendicular to the front surface 10F.

[Light Shielding Plate]

The light shielding plate 10 may be made of a metal other than stainless steel as described above. The light shielding plate 10 may be made of any of the metals listed in the modifications of the first embodiment.

The light shielding plate 10 of the second embodiment can be implemented in combination with the structure of the light shielding plate 10 of the first embodiment.

Third Embodiment

A third embodiment of the light shielding plate, the camera unit, and the electronic device will be described with reference to FIGS. 12 and 13. The third embodiment differs from the first embodiment described above in the shape of the light shielding plate. Thus, in the following, such a difference will be described in detail, and description of other portions will be omitted. In the following, the light shielding plate and examples will be described in this order.

[Light Shielding Plate]

The light shielding plate will be described with reference to FIG. 12.

Figure 12:
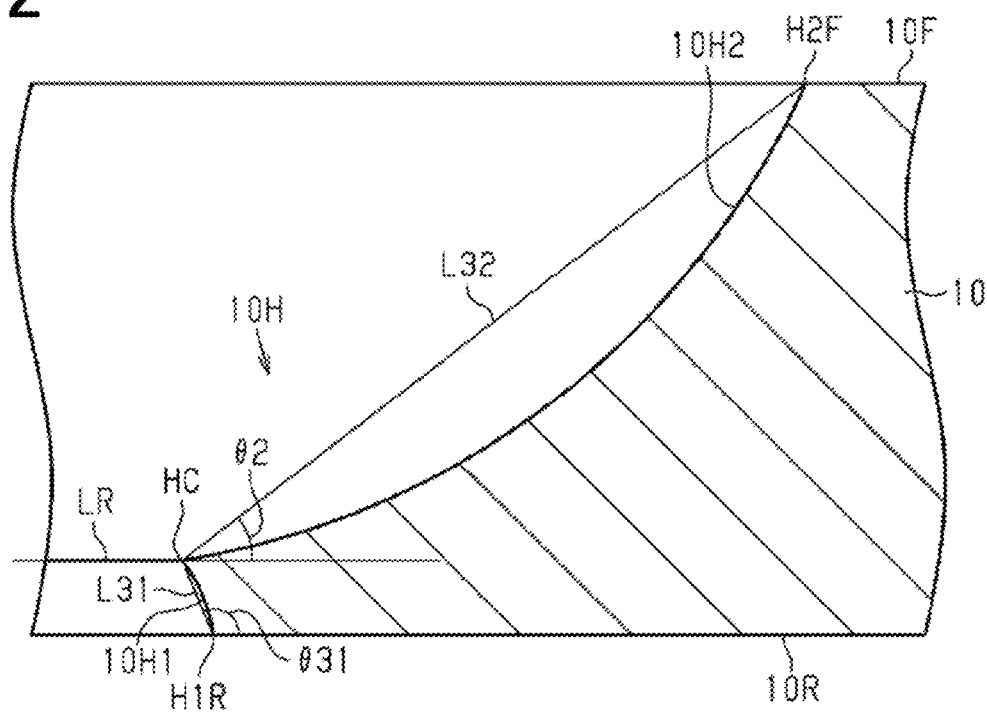
FIG. 12 is a partial enlarged cross-sectional view showing a part of a cross-section of a light shielding plate of a third embodiment.

(FIG. 12 shows an enlarged portion of the cross-sectional structure of the light shielding plate 10 shown in FIG. 2.

As shown in FIG. 12, in a cross section that is parallel to a plane perpendicular to the front surface 10F, a first straight line L31 is a straight line, i.e., a line segment, passing through the edge of the central opening HC and an edge of the rear opening H1R. A first angle θ31 is the angle formed by the first straight line L31 and the rear surface 10R. The first angle θ31 is larger than 90°. The cross section along the plane perpendicular to the front surface 10F passes through the center of the front opening H2F. In a cross section that is parallel to a plane perpendicular to the front surface 10F, the first straight line L31 is a chord of an arc connecting the central opening HC to the rear opening H1R.

In the cross section that is parallel to the plane perpendicular to the front surface 10F, the line passing through the edge of the central opening HC and parallel to the rear surface 10R is defined to be a reference line LR. Also, the shortest line connecting between the edge of the central opening HC and the edge of the front opening H2F is defined to be a second line L32. The angle between the reference line LR and the second line L32 may be 20° or more and 40° or less.

When the light shielding plate 10 is installed in a camera unit which is mounted to a front surface of a smartphone, tablet type personal computer, or notebook type personal computer, the camera unit may often capture an image of a target at a short distance. Thus, in order to address the case where the angle of view is large, the angle formed by the reference straight line LR and the second straight line L32 may be an angle in the range of 20° or more and 30° or less. When the light shielding plate 10 is mounted on an in-vehicle camera, in many cases, the camera unit captures an image of a subject at a medium to long distance. Thus, in order to address the case where the angle of view is small, the angle formed by the reference straight line LR and the second straight line L32 is preferably in the range of 300 or more and 40° or less.

Furthermore, if the light shielding plate 10 is installed in a camera unit that is mounted to the rear surface of a smartphone, the camera unit may often capture an image of a target at a short to long distance. Thus, in order to address the case where the angle of view is large, the angle formed by the reference straight line LR and the second straight line L32 may be 20° or more and 30° or less, and in order to address the case where the angle of view is small, the angle formed by the reference straight line LR and the second straight line L32 may be 30° or more and 40° or less.

Light entering the light shielding plate 10 from a direction perpendicular to the front surface 10F enters the aperture 10H from the front opening H2F formed on the front surface 10F. The light that has passed through the aperture 10H is outputted from the rear opening H1R formed in the rear surface 10R and reaches the lens LN. On the other hand, since in the light shielding plate 10, the second aperture portion 10H2 has a shape tapered from the front surface 10F toward the rear surface 10R, light entering the aperture 10H from obliquely above the front surface 10F is easily reflected by the side surface defining the first aperture portion 10H toward the front surface 10F of the light shielding plate 10.

Furthermore, it is possible to reduce the amount of light that enters the light shielding plate 10 from obliquely above the front surface 10F and is reflected by the side surface defining the aperture 10H in the vicinity of the rear opening H1R, as compared with the case where the angle formed by the first straight line L31 and the rear surface 10R is 90°. Thus, the amount of light reflected by the side surface that defines the aperture 10H for light to pass therethrough can be reduced. Consequently, unwanted light is prevented from being incident on the lens LN facing the light shielding plate 10

Light entering the second aperture portion 10H2 from obliquely above the front surface 10F is reflected by the side surface having an arc shape. Accordingly, specular light having the highest brightness in the reflected light is reflected at the arc-shaped side surface in a direction toward the front surface 10F of the light shielding plate 10. Therefore, the amount of light reflected by the side surface that defines the aperture 10H for light to pass therethrough can be further reduced.

In the light shielding plate 10, the side surface defining the first aperture portion 10H1 has an arc shape having a center of curvature located outside the light shielding plate 10. Therefore, compared to the case where the side surface defining the first aperture portion 10H1 has a linear profile, the amount of light reflected at the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

When light is incident on the side surface defining the aperture 10H from a direction that is obliquely above the front surface 10F and is deviated by a small amount from the direction perpendicular to the front surface 10F, the light incident on the side surface is easily reflected toward the front surface 10F of the light shielding plate 10, as compared with the case where the angle formed by the second straight line L32 and the reference straight line LR is larger than 40°. Therefore, the amount of light reflected by the side surface that defines the aperture 10H for light to pass therethrough can be further reduced.

EXAMPLES

Examples and comparative examples will be described with reference to FIG. 13.

Example 3-1

A stainless steel foil having a thickness of 25 μm was prepared. The rear surface of the stainless steel foil was etched to form a first aperture portion, followed by etching the front surface to form a second aperture portion. Thus, a light shielding plate having an aperture defined by the first aperture portion and the second aperture portion was obtained. The first diameter of the first aperture portion was 490 μm, and the second diameter of the second aperture portion was 571 μm.

Comparative Example 3-1

A light shielding plate of Comparative Example 3-1 was obtained as in Example 3-1 except that the stainless steel foil was punched with a die to form a circular aperture penetrating the stainless steel foil. It should be noted that, in the light shielding plate of Comparative Example 3-1, the diameter of the front opening was equal to the diameter of the rear opening, and these diameters were equal to the second diameter of Example 3-1.

Comparative Example 3-2

A light shielding plate of Comparative Example 3-2 was obtained as in Example 3-1 except that the stainless steel foil was penetrated by applying a laser beam between the bottom of the second aperture portion and the rear surface after forming the second aperture portion without forming a first aperture portion. It should be noted that, in the light shielding plate of Comparative Example 3-2, the diameter of the front opening was equal to the second diameter of Example 3-1, and the diameter of the rear opening was equal to the first diameter of Example 3-1.

[Evaluations]

Each of the light shielding plates of Example 3-1, Comparative Example 3-1, and Comparative Example 3-2 was cut parallel to a plane perpendicular to the front surface to form a measurement target. FIG. 13 shows the results obtained by capturing an image of the measurement target of Example 3-1 using a scanning electron microscope.

Figure 13:
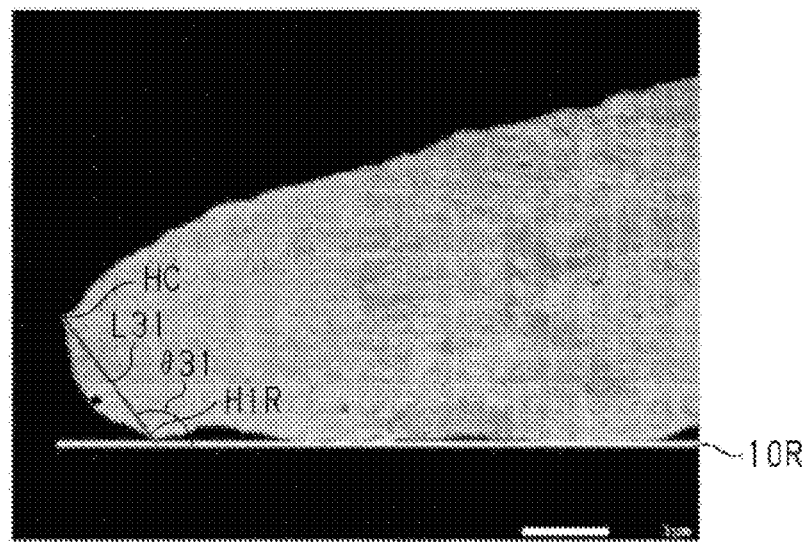
FIG. 13 is an image of a cross-sectional structure of a light shielding plate of Example 3-1.

As shown in FIG. 13, in the measurement target of Example 3-1, the first angle θ31 formed by the first straight line L31 and the rear surface 10R was 125°, that is, the first angle θ31 was larger than 90°. On the other hand, in the measurement target of Comparative Example 3-1, on the entire side surface defining the aperture, the angle formed by the side surface and the rear surface was 90°. In the measurement target of Comparative Example 3-2, the angle formed by the side surface produced by laser irradiation and the rear surface was 90°.

Before the measurement targets were formed from the light shielding plates, an image of the same object was captured in the same environment by a camera unit including each of the light shielding plates. In the image captured by the camera unit including the light shielding plate of Example 3-1, no ghost or flare was observed. On the other hand, in the image captured by the camera unit including the light shielding plate of Comparative Example 3-1 and the image captured by the camera unit including the light shielding plate of Comparative Example 3-2, at least one of ghost and flare was observed.

As described above, according to the third embodiment of the light shielding plate, the camera unit, and the electronic device, the following effects can be obtained.

(3-1) It is possible to reduce the amount of light that is reflected by the side surface defining the aperture 10H in the vicinity of the rear opening H1R. Thus, the amount of light reflected by the side surface that defines the aperture 10H for light to pass therethrough can be reduced.

(3-2) Light entering the second aperture portion 10H2 from obliquely above the front surface 10F is reflected by the side surface having an arc shape. Accordingly, specular light having the highest brightness in the reflected light is reflected at the arc-shaped side surface in a direction toward the front surface 10F of the light shielding plate 10. Therefore, the amount of light reflected by the side surface that defines the aperture 10H for light to pass therethrough can be further reduced.

(3-3) In the light shielding plate 10, the side surface defining the first aperture portion 10H1 has an arc shape having a center of curvature located outside the light shielding plate 10. Therefore, compared to the case where the side surface defining the first aperture portion 10H1 has a linear profile, the amount of light reflected at the side surface defining the aperture 10H can be reduced in the vicinity of the rear opening H1R, of the light entering the aperture from obliquely above the front surface 10F. Thus, the amount of light reflected by the side surface that defines the aperture 10H for light to pass therethrough can be further reduced.

(3-4) When light is incident on the side surface defining the aperture 10H from a direction that is obliquely above the front surface 10F and is deviated by a small amount from the direction perpendicular to the front surface 10F, the light incident on the side surface is more easily reflected toward the front surface 10F of the light shielding plate 10, as compared with the case where the angle formed by the second straight line L32 and the reference straight line LR is larger than 40°. Therefore, the amount of light reflected by the side surface that defines the aperture 10H for light to pass therethrough can be further reduced.

The third embodiment described above may be modified and implemented as follows.

[Second Angle]

The second angle θ32 formed by the second straight line L32 and the reference straight line LR may be larger than 40°. In this case as well, when the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°, an effect similar to the effect (3-1) can be obtained.

[First Aperture Portion]

The side surface defining the first aperture portion 10H1 may have a linear profile in a cross section that is parallel to a plane perpendicular to the front surface 10F. In this case as well, when the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°, an effect similar to the effect (3-1) can be obtained.

[Second Aperture Portion]

The side surface defining the second aperture portion 10H2 may have a linear shape in a cross section that is parallel to the plane perpendicular to the front surface 10F. In this case as well, when the first aperture portion 10H1 has a shape tapered from the rear surface 10R toward the front surface 10F, the second aperture portion 10H2 has a shape tapered from the front surface 10F toward the rear surface 10R, and the first angle θ31 is larger than 90°, an effect similar to the effect (3-1) can be obtained.

[Light Shielding Plate]

The light shielding plate 10 may be made of a metal other than stainless steel as described above. The light shielding plate 10 may be made of any of the metals listed in the modifications of the first embodiment.

The light shielding plate 10 of the third embodiment can be implemented in combination with at least one of the structure of the light shielding plate 10 of the first embodiment and the structure of the light shielding plate 10 of the second embodiment.

What is claimed is:

1. A light shielding plate made of metal, the light shielding plate, comprising:
a front surface located on a light incident side;
a rear surface facing away from the front surface; and
an aperture penetrating through the front surface and the rear surface, wherein
the aperture includes a first aperture portion and a second aperture portion connected to the first aperture portion via a central opening, the first aperture portion extending from a rear opening in the rear surface toward the central opening and having a shape tapered from the rear surface toward the front surface, the second aperture portion extending from a front opening in the front surface toward the central opening and having a shape tapered from the front surface toward the rear surface, the front opening being larger than the rear opening, and in a cross section that is parallel to a plane perpendicular to the front surface, an angle between the rear surface and a line connecting between the edge of the central opening and the edge of the rear opening is larger than 90°, wherein a ratio of a second length D12 between the front surface and the central opening to a first length D11 between the rear surface and the central opening (D12/D11) is 2.5 or more, wherein each of the first length and the second length are parallel to a line perpendicular to each of the front surface and the second surface.

2. The light shielding plate of claim 1, wherein in a cross section that is parallel to a plane perpendicular to the front surface, the side surface defining the second aperture portion has an arc shape, with the center of curvature of this portion of the side surface located outside the light shielding plate.

3. The light shielding plate of claim 1, wherein in a cross section that is parallel to a plane perpendicular to the front surface, the side surface defining the first aperture portion has an arc shape, with the center of curvature of this portion of the side surface located outside the light shielding plate.

4. The light shielding plate of claim 1, wherein in a cross section that is parallel to a plane perpendicular to the front surface, an angle between a line passing through the edge of the central opening and parallel to the rear surface and a shortest line connecting between the edge of the central opening to an edge of the front opening is 20° or more and 40° or less.

5. The light shielding plate of claim 1, wherein the light shielding plate has a thickness of 10 μm or more and 100 μm or less.

6. The light shielding plate of claim 1, wherein the light shielding plate is made of an iron-nickel alloy or an iron-nickel-cobalt alloy.

7. The light shielding plate of claim 6, wherein the light shielding plate is made of Invar or Super Invar.

8. A camera unit comprising the light shielding plate of claim 1.

9. An electronic device comprising the camera unit of claim 8.

10. A method of producing a light shielding plate, the method comprising the steps are:
   disposing a resist layer on each of a front surface and a rear surface of a metal foil;
   exposing and developing the resist layers to form a resist mask from each of the resist layers;
   forming, on the metal foil by using the resist mask formed on the rear surface, a first aperture portion having a rear opening on the rear surface and having a shape tapered from the rear surface toward the front surface; and
   after forming the first aperture portion, forming, on the metal foil by using the resist mask formed on the front surface, a second aperture portion so that the second aperture portion is connected to the first aperture portion, the second aperture portion having a front opening on the front surface and having a shape tapered from the front surface toward the rear surface, wherein
   in the step of forming the first aperture portion and the step of forming the second aperture portion, the first aperture portion and the second aperture portion are formed so that in a cross section that is parallel to a plane perpendicular to the front surface, an angle between the line connecting between the edge of the central opening at which the second aperture portion is connected to the first aperture portion and the edge of the rear opening, and the rear surface is larger than 90°, wherein a ratio of a second length $D12$ between the front surface and the central opening to a first length $D11$ between the rear surface and the central opening ($D12/D11$) is 2.5 or more, wherein each of the first length and the second length are parallel to a line perpendicular to each of the front surface and the second surface.

* * * * *